United States Patent
Schwenk et al.

(10) Patent No.: US 9,577,669 B2
(45) Date of Patent: Feb. 21, 2017

(54) METHODS, SYSTEMS, AND COMPUTER READABLE MEDIA FOR OPTIMIZED MESSAGE DECODING

(71) Applicant: Ixia, Calabasas, CA (US)

(72) Inventors: Alan Richard Schwenk, Raleigh, NC (US); Avinash Raj, Cary, NC (US)

(73) Assignee: Ixia, Calabasas, CA (US)

( * ) Notice: Subject to any disclaimer, the term of this patent is extended or adjusted under 35 U.S.C. 154(b) by 137 days.

(21) Appl. No.: 14/531,953

(22) Filed: Nov. 3, 2014

(65) Prior Publication Data
US 2016/0126976 A1    May 5, 2016

(51) Int. Cl.
*H03M 7/42* (2006.01)
*H03M 7/30* (2006.01)

(52) U.S. Cl.
CPC ........... *H03M 7/425* (2013.01); *H03M 7/3088* (2013.01); *H03M 7/42* (2013.01)

(58) Field of Classification Search
CPC ................... H04Q 11/0478; H04L 2012/5652; H04L 29/0653; H04L 47/10; H04L 29/06
USPC .......................................... 713/170; 370/474
See application file for complete search history.

(56) References Cited

U.S. PATENT DOCUMENTS

| | | | |
|---|---|---|---|
| 5,717,760 A * | 2/1998 | Satterfield | H04L 9/0656 380/265 |
| 8,724,498 B2 | 5/2014 | Choi et al. | |
| 2008/0049861 A1 * | 2/2008 | Yang | H04L 1/0079 375/262 |
| 2010/0184447 A1 | 7/2010 | Miki et al. | |
| 2010/0195743 A1 | 8/2010 | Barsoum et al. | |
| 2010/0290371 A1 | 11/2010 | Beale | |
| 2011/0086659 A1 | 4/2011 | Yoon et al. | |
| 2011/0170439 A1 | 7/2011 | Miki et al. | |
| 2011/0206151 A1 | 8/2011 | McCloud et al. | |
| 2012/0033650 A1 | 2/2012 | Ahn et al. | |
| 2012/0051271 A1 | 3/2012 | Beale | |
| 2012/0063384 A1 | 3/2012 | Bi et al. | |
| 2016/0261723 A1 | 9/2016 | Bergeron | |

OTHER PUBLICATIONS

Notice of Allowance for U.S. Appl. No. 13/396,577 (Dec. 18, 2013).
Non-Final Office Action for U.S. Appl. No. 13/396,577 (Aug. 8, 2013).

(Continued)

*Primary Examiner* — Baotran N To
(74) *Attorney, Agent, or Firm* — Jenkins, Wilson, Taylor & Hunt, P.A.

(57) ABSTRACT

Methods, systems, and computer readable media for optimized message decoding are disclosed. According to one exemplary method, the method includes receiving a message containing one or more information elements (IEs). The method also includes determining a length associated with the message. The method further includes determining, using the length associated with message, whether the message can be accurately decoded using a mask stored in a memory. The method also includes in response to determining that the message can be accurately decoded using the mask, decoding the message using the mask.

17 Claims, 6 Drawing Sheets

(56) References Cited

OTHER PUBLICATIONS

"3rd Generation Partnership Project; Technical Specification Group Radio Access Network; Evolved Universal Terrestrial Radio Access (E-UTRA); Physical layer procedures (Release 10)," 3GPP TS 36.213, V10.3.0 (Sep. 2011).
"3rd Generation Partnership Project; Technical Specification Group Radio Access Network; Evolved Universal Terrestrial Radio Access (E-UTRA); Multiplexing and channel coding (Release 10)," 3GPP TS 36.212, V10.3.0 (Sep. 2011).
"3rd Generation Partnership Project; Technical Specification Group Radio Access Network; Evolved Universal Terrestrial Radio Access (E-UTRA); Physical Channels and Modulation (Release 10)," 3GPP TS 36.211, V10.3.0 (Sep. 2011).
"LTE; Evolved Universal Terrestrial Access (E-UTRA); Physical layer; Measurements (3GPP TS 36.214 version 10.1.0 Release 10)," ETSI TS 136 214, V10.1.0 (Apr. 2011).

* cited by examiner

| Key1 | Value1 | Data1 |
|------|--------|-------|
|      | Value2 | Data2 |
|      | Value3 | Data3 |
|      | Value4 | Data4 |
| Key2 | Value1 | Data1 |
|      | Value2 | Data2 |
|      | Value3 | Data3 |
| Key3 | Value1 | Data1 |
|      | Value2 | Data2 |
|      | Value3 | Data3 |
|      | Value4 | Date4 |

METHODS, SYSTEMS, AND COMPUTER READABLE MEDIA FOR OPTIMIZED MESSAGE DECODING

TECHNICAL FIELD

The subject matter described herein relates to message communications. More specifically, the subject matter relates to methods, systems, and computer readable media for optimized message decoding.

BACKGROUND

Many nodes (e.g., computing platforms, smartphones, or network devices) communicate data via messages, e.g., Internet protocol (IP) messages. Receiving nodes typically must parse, analyze, and/or decode header information stored in the messages to accurately process the messages. For example, a receiving node may attempt to identify a related message protocol associated with a message. A message protocol may define the content or form of a message in a standardized manner, so that entities using the protocol can communicate with each other unambiguously. A message may have distinct parts with distinct functions. For example, a message may include a routing header that identifies the sender and intended receiver of the message, a payload section that includes the content of the message that is to be delivered, and a checksum that may be used to detect and possibly correct errors that may have been injected into the message while in transit. These distinct parts are commonly referred to as information elements (IEs).

A message protocol may define several different varieties or types of messages. These message types may share some common IEs, such as the routing header or checksum, but may also have IEs that are unique to each type of message. For example, each message may include a message type identifier so that the receiving entity may unambiguously determine which type of message it is receiving and thus know what IEs that message should contain. For each type of message, the message protocol may define not only what IEs that type of message should contain but also what order that the IEs should appear within the message.

An entity that receives messages that adhere to a message protocol may use a programming construct called a protocol tree to parse the received messages. Protocol trees define one or more valid message formats. A familiar example is the hypertext transport protocol, or HTTP. HTTP defines a number of request types, including GET, PUT, POST, HEAD, DELETE, and TRACE. The following pseudo code represents the actions that might be taken by a parsing function that traverses an HTTP protocol tree that, for the sake of this example, is not optimally organized:

```
1    receive HTTP message;
2    read HTTP message_type from the message type IE;
3    IF message_type = TRACE THEN
4        process TRACE message
5    ELSE IF message_type = DELETE THEN
6        process DELETE message
7    ELSE IF message_type = HEAD THEN
8        process HEAD message
9    ELSE IF message_type = POST THEN
10        process POST message
11    ELSE IF message_type = PUT THEN
12        process PUT message
13    ELSE IF message_type = GET THEN
14        process GET message
15    END IF
```

In the pseudo code shown above, the parsing function traverses the protocol tree in the order in which the branches exist within the tree: the first branch defines the expected structure of a TRACE message, the second branch defines the expected structure of a DELETE message, and so on through the list of valid message types. If the most commonly received message type is the GET message, however, this means that for most messages the parsing function performs five separate and time consuming tests—TRACE, DELETE, HEAD, POST, and PUT—before it correctly matches GET. The efficiency of this parsing function could be improved by providing a new protocol tree whose first branch defines the expected structure of a GET message, whose second branch defines the expected message for the next most common message type, such as PUT for example, and so on. If the environment in which this parser and its improved protocol tree operates is one in which the least expected message type occurs the most often, however, the improved protocol tree suffers the same inefficiencies as before. In a conventional system that uses a protocol tree, the performance of the parsing function can vary greatly depending on the specific traffic received.

The example above illustrates the point that the order of IEs in a received protocol message could affect the performance of a decoding function if the order of IEs received doesn't match the order of the implemented protocol tree. These inefficiencies become more and more significant as the size of the protocol tree increases. Protocol trees that handle multiple protocols or protocols with many message types and/or significant variations of IEs within a message type can be quite large and are even more susceptible to this kind of inefficiency.

Accordingly, a need exists for methods, systems, and computer readable media for optimized message decoding.

SUMMARY

Methods, systems, and computer readable media for optimized message decoding are disclosed. According to one exemplary method, the method includes receiving a message containing one or more information elements (IEs). The method also includes determining a length associated with the message. The method further includes determining, using the length associated with message, whether the message can be accurately decoded using a mask stored in a memory. The method also includes in response to determining that the message can be accurately decoded using the mask, decoding the message using the mask.

According to one exemplary system, the system includes a memory and a message decoder module (MDM) implemented using the memory. The MDM is configured to receive a message containing one or more IEs, to determine a length associated with the message, to determine, using the length associated with message, whether the message can be accurately decoded using a mask stored in a memory, and in response to determining that the message can be accurately decoded using the mask, to decode the message using the mask.

The subject matter described herein may be implemented in software in combination with hardware and/or firmware. For example, the subject matter described herein may be implemented in software executed by a processor. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory devices, such as disk memory devices, chip memory devices, programmable logic devices, field-programmable gate arrays, and application specific integrated circuits. In addition, a computer readable medium that implements the subject matter described herein may be located on a single device or computing platform or may be distributed across multiple devices or computing platforms.

As used herein, the term "node" refers to a physical computing platform including one or more processors and memory.

As used herein, the terms "function" or "module" refer to hardware, firmware, or software in combination with hardware and/or firmware for implementing features described herein.

As used herein, the term "message" refers to a packet, a frame, or other units of data, e.g., transferrable in a communications network.

As used herein, the term "IE" refers to any type-length-value element, attribute value pair (AVP), or other data construct usable for providing information in a communication protocol packet or message.

BRIEF DESCRIPTION OF THE DRAWINGS

The subject matter described herein will now be explained with reference to the accompanying drawings of which:

FIG. 4 is a diagram illustrating exemplary decode information according to an embodiment of the subject matter described herein;

DETAILED DESCRIPTION

The subject matter described herein includes methods, systems, and computer readable media for optimized message decoding. The amount of time taken for nodes or applications to decode incoming messages using conventional protocol tree related decoding can significantly impact the overall performance of a system. For example, a testing platform (e.g., mobile test systems which generate multi-UE or multi-session traffic) may be configured to emulate multiple different nodes and may communicate (e.g., send and receive) numerous messages between its emulated nodes and one or more system(s) under test (SUT) for testing load capacity, reliability, and/or other attributes of the SUT. While a conventional protocol tree decoder may be capable of decoding messages, systems (e.g., testing devices and/or platforms) that need to decode a significant number of messages may find using a conventional protocol tree decoder to be inefficient and/or too slow for various purposes.

In accordance with some aspects of the subject matter described herein, techniques for optimized message decoding may include generating and/or using a mask (e.g., a bitmask, a multi-bitmask, a byte mask, or a multi-byte mask) for decoding a message. For example, a bitmask may be generated and stored based on a previous message decoded using protocol tree related decoding. In this example, information in a subsequent message may be masked with the bitmask to determine relevant header information. In this example, the relevant header information may be inspected (e.g., hashed and compared to match information associated with the bitmask) for determining whether the message may be accurately decoded using stored decode information associated with the mask. If so, the incoming message may be decoded using the decode information in lieu of (e.g., without requiring) protocol tree related decoding.

Advantageously, in accordance with some aspects of the subject matter described herein, techniques for optimized message decoding may utilize mask related decoding for some messages (e.g., messages associated with frequently received message protocols or types) and may utilize protocol tree related decoding for other messages. Since many environments, including test environments, involve messages associated with a small subset of possible message protocols or types in existence, mask related decoding may be able to decode a substantial number of received messages in such environments, while also minimizing the amount of messages decoded using protocol tree related decoding.

Reference will now be made in detail to exemplary embodiments of the subject matter described herein, examples of which are illustrated in the accompanying drawings. Wherever possible, the same reference numbers will be used throughout the drawings to refer to the same or like parts.

Figure 1:
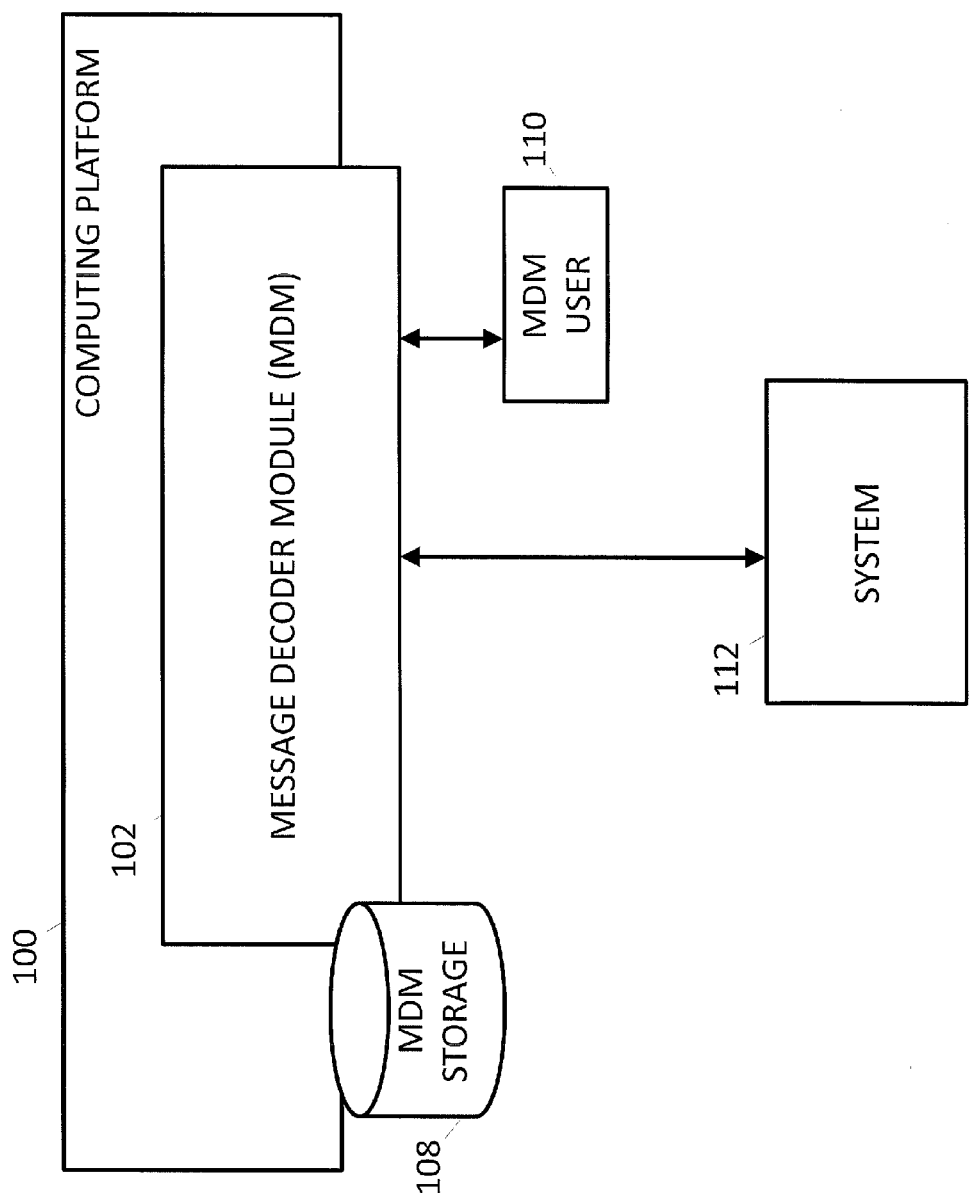
FIG. 1 is a diagram illustrating an exemplary message decoder module (MDM) for optimized message decoding according to an embodiment of the subject matter described herein.

FIG. 1 is a diagram illustrating an exemplary message decoder module (MDM) 102 for optimized message decoding according to an embodiment of the subject matter described herein. Referring to FIG. 1, each of computing platform 100 and system 112 may represent any suitable entity or entities (e.g., one or more nodes or devices) capable of communicating (e.g., receiving or sending) data via messages.

In some embodiments, computing platform 100 may be a stand-alone tool, a testing device, or software executing on a processor. In some embodiments, computing platform 100 may be a single node or may include functionality distributed across multiple computing platforms or nodes.

In some embodiments, system 112 may include a network device, a network module, a node, or a system of devices, nodes, and/or modules. In some embodiments, system 112 may include one or more system(s) under test (SUT). For example, computing platform 100 may be configured to receive from and send messages to system 112 for testing or analyzing the capabilities of system 112.

Computing platform 100 may include or access MDM 102. MDM 102 may represent any suitable entity or entities (e.g., a computing platform, software executing on a processor, a logic device, an ASIC, and/or an FPGA) for performing one or more aspects associated with optimized message decoding. For example, MDM 102 may include an IP message parser capable of receiving messages associated with various protocols communicated to or from computing platform 100 and/or system 112. In this example, MDM 102 may be configured to parse, inspect, and/or analyze message information (e.g., message header information) for decoding (e.g., classifying or identifying) a message or portions therein.

In some embodiments, MDM 102 may include one or more communications interfaces for interacting with users, systems, and/or nodes. For example, MDM 102 may provide a communications interface for communicating with MDM user 110. In some embodiments, MDM user 110 may be an automated system or may be controlled or controllable by a human user. MDM user 110 may select and/or configure information for inspecting, decoding, and/or identifying messages.

MDM 102 may include one or more communications interfaces for receiving and sending various types of messages; such as IP messages, IP version 4 (v4) messages, IP version 6 (v6) messages, transmission control protocol (TCP) messages, stream control transmission protocol (SCTP) messages, real-time transport protocol (RTP) messages, or reliable data protocol (RDP) messages, general packet radio service (GPRS) tunneling protocol (GTP) messages, messages using another tunneling protocol, and/or other messages.

MDM 102 may include functionality (e.g., software executing on a processor or other hardware) for inspecting received messages, or portions therein, for particular data, e.g., bit or byte sequences. For example, MDM 102 may be configured to inspect a message header for particular pattern of bits indicative of a particular protocol, session, or type and may be configured to inspect a message header based on relative locations, such as message offsets or byte offsets.

In some embodiments, MDM 102 may be configured to identify (e.g., classify, parse and/or decode) messages based on one or more logic rules. For example, MDM 102 may utilize a protocol tree (e.g., a binary and/or decision tree) containing conditional statements (e.g., "if-else" logic).

In some embodiments, MDM 102 may be configured to identify (e.g., classify, parse, and/or decode) messages using one or masks and/or other mask related information (e.g., match information and/or decode information associated with a mask) in MDM storage 108. For example, MDM 102 may include a complex programmable logic device (CPLD) or an FPGA configured to perform bitwise operations using a mask and a message or portion therein. After performing a bitwise operation, MDM 102 may be configured to generate a message key and compare the message key to match information (e.g., a mask key) associated with the mask. If a match is found, decode information (e.g., message offset values and/or length data) associated with the mask may be utilized to decode the message or portions therein.

In some embodiments, MDM 102 may be capable of decoding messages using parallel processing (e.g., performing mask related decoding using multiple masks concurrently) or serial processing (e.g., performing mask related decoding using one mask at a time).

In some embodiments, protocol tree related decoding may generally be slower to identify a message than mask related decoding. For example, protocol tree related decoding may use a software implemented protocol tree for identifying messages and mask related decoding may use a hardware implemented parser and/or bitwise comparison engine for identifying messages. In this example, protocol tree related decoding may require more resources (e.g., processor cycles) and/or time than mask related decoding to accurately identify a message.

In some embodiments, MDM 102 may be configured to perform optimized message decoding by using stored masks for quickly decoding at least some messages and using a protocol tree for decoding other messages. In such embodiments, MDM 102 may monitor received messages and may generate and store masks for the most frequently received message protocols such that protocol tree related decoding is minimized, thereby optimizing message decoding.

MDM storage 108 may represent any suitable entity (e.g., a non-transitory computer readable medium or a memory device) for storing data associated with message flows, messages, or IEs. Exemplary data stored at MDM may include masks, mask related information (e.g., a length associated with a mask, match information for determining messages that can be decoded using the mask, and decode information for decoding matching messages), message header information, decode statistics, a protocol tree, and/or related protocol tree logic.

In some embodiments, MDM storage 108 may be integrated with or accessible by MDM 102 or modules therein or a node distinct from MDM 102, such as computing platform 100 or system 112. For example, MDM 102 may parse bits and/or bytes associated with a message and store this data in a cache. In this example, MDM 102 may be configured to access the cache and use the stored message header information when attempting to decode the message.

In some embodiments, MDM 102 may include functionality for providing information about an identified message to one or more entities (e.g., nodes, software, and/or modules). For example, MDM 102 or a module therein may classify or identify a message as being associated with an HTTP message. In this example, after identifying the message as being associated with an HTTP message, MDM 102 may decode IEs or related values therein and provide this information to one or more entities, where the entities may perform further processing.

It will be appreciated that FIG. 1 is for illustrative purposes and that various nodes, their locations, and/or their functions described above in relation to FIG. 1 may be changed, altered, added, or removed. For example, some nodes and/or functions may be combined into a single entity, e.g., MDM 102 may be integrated with computing platform 100 or system 112.

Figure 2:
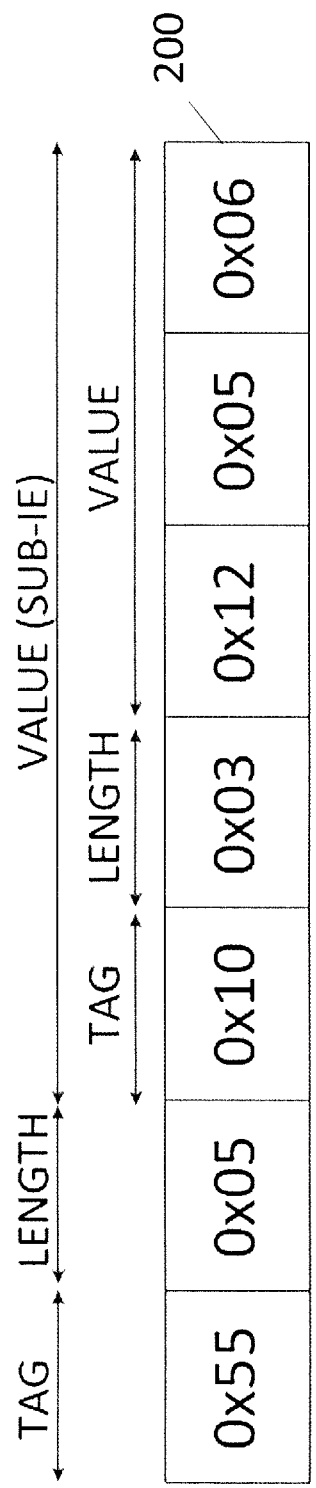
FIG. 2 is a diagram illustrating an exemplary message portion according to an embodiment of the subject matter described herein.

FIG. 2 is a diagram illustrating an exemplary message portion 200 according to an embodiment of the subject matter described herein. Message portion 200 may include header information and/or may include one or more IEs. For example, an IE may include a TLV element or an attribute value pair (AVP).

In some embodiments, MDM 102 may be configured to decode IEs in the message using protocol tree related decoding. In some embodiments, protocol tree related decoding may include using a protocol tree to identify a message as being associated with a particular protocol and/or for decoding the message. In some embodiments, protocol tree related decoding may also include IE decoding for decoding IEs in a message associated with a particular protocol. For example, IE decoding or related steps may be included in a protocol tree, e.g., as elements or decision points in the protocol tree.

In some embodiments, IE decoding may include receiving a message containing an IE, checking a tag or identifier associated with the IE, extracting or determining a length associated with the IE, and obtaining the value associated with the IE.

In some embodiments, IE decoding or steps therein may be performed for each received message and may utilize a significant amount of resources and/or time. For example, inspecting a message for a tag and determining a length associated with an IE may require significant processing resources, but the information may not be saved, since MDM 102 may only require the values for further processing.

In some embodiments, optimized message decoding may involve minimizing IE decoding associated with protocol tree related decoding and, instead, may use decode information associated with a previously decoded message for quickly decoding IEs in received messages. For example, decode information associated with a mask may be usable to identify location or offsets in a message that indicate the beginning of IEs or values therein. In this example, the decode information may also indicate a length of each IE or values therein. By identifying the appropriate portions of a message to decode using stored data associated with a previously decoded message, MDM 102 may quickly decode relevant information without performing resource expensive processing (e.g., tag and length analysis) associated with IE decoding.

Referring to FIG. 2, message portion 200 may include seven octets (e.g., eight bits) represented by a hexadecimal sequence '0x55, 0x05, 0x10, 0x03, 0x12, 0x05, 0x06'. As depicted in FIG. 2, message portion 200 may include an IE containing a tag parameter value ('0x55'), a length parameter value ('0x05'), and a value parameter value ('0x10, 0x03, 0x12, 0x05, 0x06'). The value parameter value may include an inner or sub IE containing a tag parameter value ('0x10'), a length parameter value ('0x03'), and a value parameter value ('0x12, 0x05, 0x06').

In some embodiments, MDM 102 may be configured to use IE decoding for decoding messages and/or IEs therein. For example, MDM 102 may decode message portion 200 by identifying a first tag parameter value and a length parameter value associated with the first tag parameter value, and using this information may identify and obtain the value parameter value, e.g., since the start of the value parameter value is known to immediately succeed the end of the length parameter value and the end of the value parameter value can be determined by the length parameter value. In this example, MDM 102 may be configured to decode subsequent IEs in message portion 200 in a similar manner until MDM 102 obtains all value parameter values of the IEs.

In some embodiments, MDM 102 may generate a mask for use with a bitwise operation. In such embodiments, the mask, in conjunction with the bitwise operation, may be usable for identifying messages that can be accurately decoding using decode information associated with the same mask. For example, a mask 'FF,FF,FF,FF,00,00,00' may be applied to message portion 200 using a bitwise and operation, where the resulting hexadecimal sequence is "0x55, 0x05, 0x10, 0x03, 0x00, 0x00, 0x00'. The resulting hexadecimal sequence may include tag parameter values and length parameter values, while omitting value parameter values. By using the resulting hexadecimal sequence as comparison information, messages that contain the same IE tags and IE lengths (even if the value parameter values are different) may be identified as messages that can be accurately decoding using the same decode information, since the locations (e.g., message offset values) and length of the value parameter values are the same for these messages.

In some embodiments, MDM 102 may be configured to generate, obtain, and/or store a mask and/or other mask related information for decoding messages and/or IEs therein. For example, mask related information usable for decoding message portion 200 may be stored in a memory. In this example, the mask related information may have been generated and/or obtained by MDM 102 when decoding a previous similar message using protocol tree related decoding and IE decoding. For example, MDM 102 may be configured to store a tag parameter value and a length parameter value for a message, where the information is indexed by match information (e.g., a mask key). In this example, the match information may be generated using a bitmask and operation and may identify messages that can be accurately decoded using a corresponding mask. Continuing with the example, decode information (e.g., locations and lengths of value parameter values) may be stored in a data structure for easily decoding IEs in matching messages, where the decode information is indexed or otherwise identified using the match information.

In some embodiments, mask related information may include a mask for identifying relevant header information (e.g., static values or bits usable to identify a message as being associated with a particular protocol or having a set of IEs), a mask length, match information associated with the mask for determining whether a message can be accurately decoded using the mask, or decode information associated with the mask for decoding IEs in a matching message.

In some embodiments, MDM 102 may be configured to use a mask and/or other mask related information for decoding messages and/or IEs therein. For example, MDM 102 may attempt to decode each and every received message using mask related decoding if relevant mask related information is available. In this example, by using stored mask related information, decoding the same or similar message types and/or IEs using protocol tree related decoding is avoided.

While message portion 200 illustrates a hex based protocol, it will be appreciated that aspects of the subject matter described herein may be utilize to decode messages associated with other protocols, such as packet encoding rules (PER) based protocols. For example, mask related decoding can be beneficial for PER based protocols where parameter values are encoded using bit wise operator, as the parameter values may not start at a word or byte boundary, and, as such, IE decoding of such messages are cumbersome.

It will also be appreciated that message portion 200 is for illustrative purposes and that different and/or additional information may be included in a message or portion therein.

Figure 3:
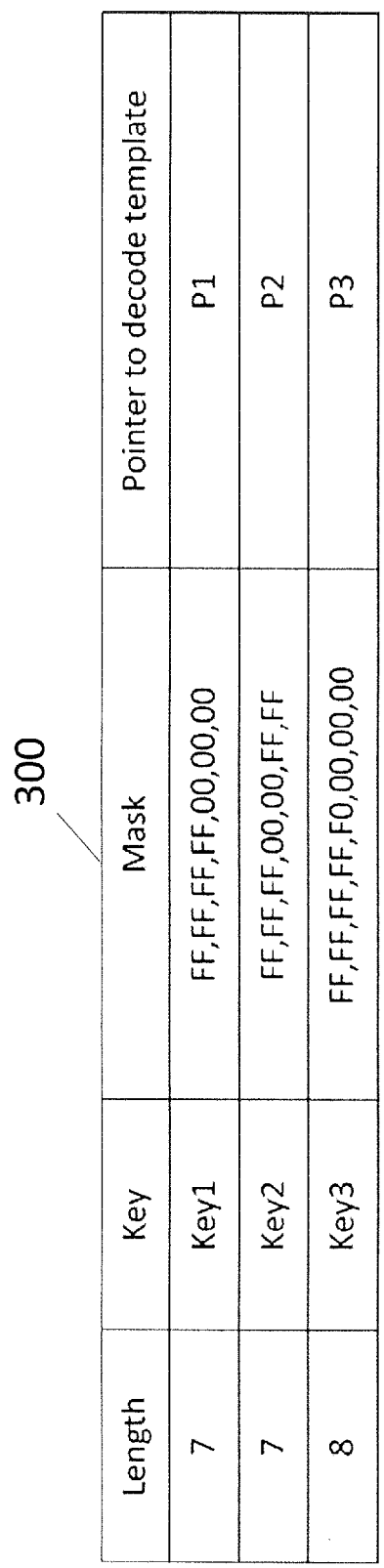
FIG. 3 is a diagram illustrating exemplary mask related information according to an embodiment of the subject matter described herein.

FIG. 3 is a diagram illustrating exemplary mask related information 300 according to an embodiment of the subject matter described herein. Mask related information 300 may include any suitable information usable for identifying and/or decoding a message or portion therein using a mask. In some embodiments, mask related information 300 may be accessible by computing platform 100 and/or MDM 102. In some embodiments, mask related information 300 may be stored in MDM storage 108 using various data structures. In some embodiments, mask related information 300 may include a mask, a mask length, a mask key (e.g., match information), and decode information or a pointer to decode information.

In some embodiments, mask related information 300 may be stored for various protocols and/or message variations. For example, mask related information 300 may include information (e.g., a first mask) for decoding a TCP message where IEs are in order from 'A-C' and may include different information (e.g., a second mask) for decoding a TCP message where IEs are in order from 'C-A'. In another example, mask related information 300 may include information (e.g., a first mask) for decoding a TCP message and may include information (e.g., a second mask) for decoding a UDP message.

Referring to FIG. 3, mask related information 300 may be stored in one or more indexable and/or searchable data structures, such as a table, a hash map, and/or an array. For example, as depicted in FIG. 3, a mask key 'Key1" may be associated with a mask length '7', a mask 'FF,FF,FF,FF,00, 00,00' and a decode pointer P1'; a mask key 'Key2" may be associated with a mask length '7', a mask 'FF,FF,FF,00,00, FF,FF' and a decode pointer 'P2'; and a mask key 'Key3" may be associated with a mask length '8', a mask 'FF,FF, FF,FF,00,00,00' and a decode pointer 'P3'.

In some embodiments, each type of mask related information 300 may be stored in a separate data structure. For example, a first array or hash map may store mask lengths, where each mask length is indexed by a mask key (e.g., LENGTHS(key)); a second array or hash map may store masks, where each mask is indexed by a mask key (e.g., MASKS(key)); and a third array or hash map may store a decode pointer for pointing to decode information, where each decode pointer is indexed by a mask key (e.g., POINTERS(key)).

In some embodiments, MDM 102 may be configured to compare a length of a received message and one or more stored mask lengths, e.g., by iterating through an array containing all stored mask lengths. If a suitable mask length is found (e.g., a mask length matches a length associated with a received message), MDM 102 may identify a mask key corresponding to the suitable mask length. Using the mask key, MDM 102 may determine a relevant stored mask, e.g., by utilizing an array of masks indexed by mask keys. After determining the mask, MDM 102 may be configured to generate comparison information by applying a bitwise and operation and the mask on the received message to a receive message or portion therein. MDM 102 may use the comparison information to generate a message key. After generating the message key, MDM 102 may compare the message key and the mask key. If the message key matches the mask key, MDM 102 may determine that the message can be accurately decoded using the mask and MDM 102 may use decode information associated with the mask for decoding IEs (e.g., obtaining value parameter values) in the message. If the message key does not match the mask key, MDM 102 may determine that the message cannot be accurately decoded using the mask and MDM 102 may attempt to decode the message using a different mask (e.g., a different mask having a suitable length) or may decode the message using protocol tree related decoding.

It will be appreciated that mask related information 300 is for illustrative purposes and that different and/or additional information may be utilized for decoding messages or portions therein.

FIG. 4 is a diagram illustrating exemplary decode information 400 according to an embodiment of the subject matter described herein. Decode information 400 may include any suitable information usable for decode an IE or portion therein. In some embodiments, decode information 400 may be accessible by computing platform 100 and/or MDM 102. In some embodiments, decode information 400 may be stored in MDM storage 108 using various data structures. In some embodiments, decode information 400 may include message offset values for indicating locations of IEs or parameter values therein, tags identifying IEs or parameter values therein, and/or lengths of IEs or parameter values therein In some embodiments, decode information 400 may be stored in one or more data structures and may be indexed by one or more keys. For example, as depicted in FIG. 4, a hash map may store one or more arrays, where at least one of the arrays is indexed by a mask key. In this example, a mask key 'Key1" may be associated with a first decode array containing a set of value elements and associated data elements; a mask key 'Key2" may be associated with a second decode array containing a set of value elements and associated data elements; and a mask key 'Key3" may be associated with a third decode array containing a set of value elements and associated data elements.

In some embodiments, each decode array may include data elements indexed by key value elements. For example, each data element may include a tag parameter value and/or a length parameter value, where each data element is indexed by a key value indicating a message offset value. In another example, each data element may include a message offset value and/or a length parameter value, where each data element is indexed by a key value indicating a tag parameter value.

In some embodiments, MDM 102 may be configured to identify, using a mask key, relevant decode information 400 for a received message and may use relevant decode information 400 to decode IEs in the message. For example, using a decode pointer or a related mask key, MDM 102 may quickly decode IEs in a message using message offset values and length parameter values stored in an associated decode array. In this example, MDM 102 may use message offset values and length parameter values to quickly locate, identify, and obtain relevant values in the received message.

It will be appreciated that decode information 400 is for illustrative purposes and that different and/or additional information may be utilized for decoding messages or portions therein.

Figure 5:
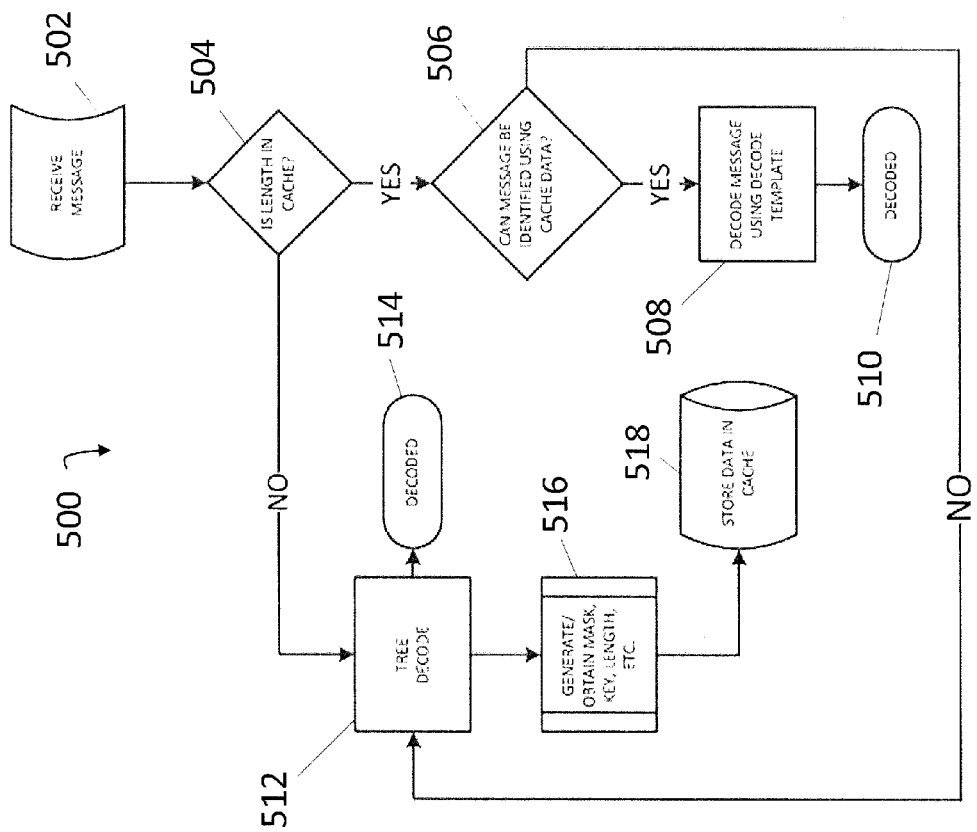
FIG. 5 is a diagram illustrating an exemplary process for decoding a message according to an embodiment of the subject matter described herein.

FIG. 5 is a diagram illustrating an exemplary process for decoding a message according to an embodiment of the subject matter described herein. In some embodiments, exemplary process 500, or portions thereof, may be performed by or at computing platform 100, MDM 102, and/or another node or module. In some embodiments, exemplary process 500 may include steps 502, 504, 506, 508, 510, 512, 514, 516, and/or 518.

At step 502, a message containing one or more IEs may be received. For example, a TCP message may be received that includes a header portion and a payload portion containing one or more IEs.

At step 504, it may be determined whether a length associated with the message is associated with cache data. If it is determined that the length associated with the message is associated with the cache data, then step 506 may occur and if not, then step 512 may occur.

In some embodiments, MDM 102 may be configured to select a mask having a same length as a length associated with a message to be decoded. In this example, the lengths associated with the masks and/or mask related information may be stored in a searchable data structure, e.g., an array or a hash map.

In some embodiments, MDM 102 may be configured to attempt to decode the message using all relevant masks (e.g., masks having the same length as a message to be decoded), e.g., by iterating through each mask until the message is decoded or until it is determined that the message cannot be accurately decoded using any stored masks.

At step 506, it may be determined whether the message can be identified (e.g., decoded) using the cache data. If it is determined that the message can be identified using the cache data, then step 508 may occur and if not, then step 512 may occur.

In some embodiments, MDM 102 may be configured to generate a message key associated with the message and to compare the message key and match information (e.g., a mask key) associated with the mask, where the message can be identified and/or decoded if the message key matches the match information.

At step 508, in response to determining that the message can be accurately decoded using the mask, the message may be decoded using the mask. For example, MDM 102 may be configured to determine relevant decode information 400 and use the decode information 400 to decode one or more IEs.

At step 510, after being decoded, the message may be further processed.

At step 512, a message may be decoded using a protocol tree. For example, MDM 102 may be configured to use a protocol tree and identify a message as being associated with a particular. After determining the particular protocol, MDM 102 may decode one or more IEs in the message.

At step 514, after being decoded, the message may be further processed.

In some embodiments, step 516 may occur. For example, MDM 102 may be configured to generate a mask and/or mask related information associated with the message decoded using the protocol tree so as to avoid using the protocol tree when decoding similar messages in the future.

In some embodiments, step 516 may occur only when MDM 102 determines that a substantial amount of similar messages (e.g., to the message decoded) is likely to be received.

At step 516, mask related information may be generated and/or obtained based on the protocol tree related decoding. For example, MDM 102 may be configured to generate a mask associated with protocol tree related decoding. In this example, MDM 102 may also generate and/or obtain a mask length, match information associated with the mask for determining whether a message can be accurately decoded using the mask, and/or decode information 400 for decoding IEs in a matching message.

At step 518, the mask related information may be stored in the cache and may be usable for decoding subsequent messages.

It will also be appreciated that exemplary process 500 is for illustrative purposes and that different and/or additional actions may be used. It will also be appreciated that various actions described herein may occur in a different order or sequence.

Figure 6:
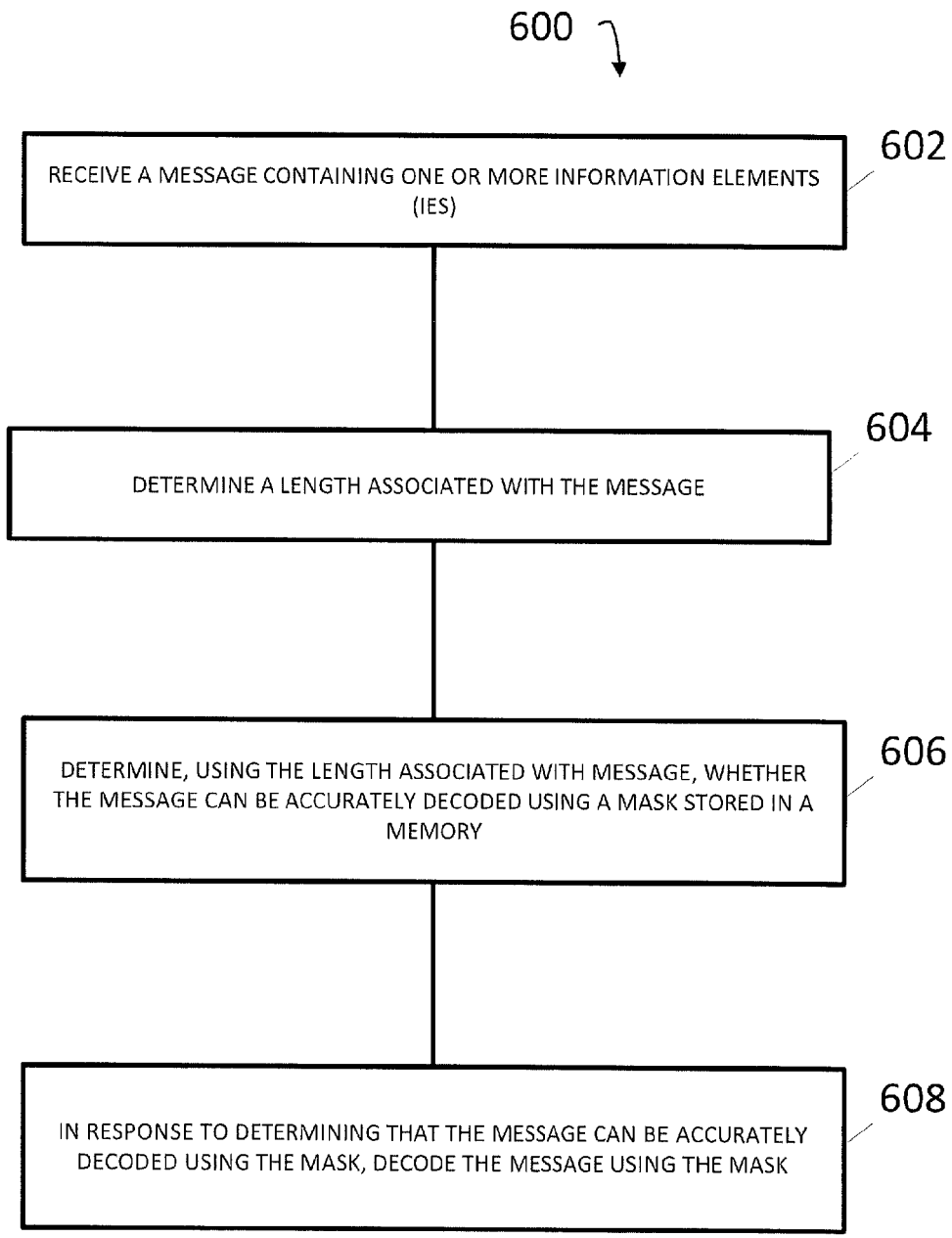
FIG. 6 is a diagram illustrating an exemplary process for optimized message decoding according to an embodiment of the subject matter described herein.

FIG. 6 is a diagram illustrating an exemplary process 600 for optimized message decoding according to an embodiment of the subject matter described herein. In some embodiments, exemplary process 600, or portions thereof, may be performed by or at computing platform 100, MDM 102, and/or another node or module. In some embodiments, exemplary process 600 may include steps 602, 604, 606, and/or 608.

At step 602, a message containing one or more IEs may be received. For example, a HTTP message may be received that includes a header portion and a payload portion containing one or more IEs.

At step 604, a length associated with the message may be determined. For example, MDM 102 may be configured to inspect header information for determining a length parameter value associated with the message.

At step 606, it may be determined, using the length associated with the message, whether the message can be accurately decoded using a mask stored in a memory. For example, MDM 102 may be configured to select a mask having a same length as a length associated with a message to be decoded. In this example, MDM 102 may be configured to attempt to decode the message using all relevant masks until the message is decoded or until it is determined that the message cannot be accurately decoded using any stored masks.

In some embodiments, a mask may include a bitmask, a multi-bitmask, a byte mask, or a multi-byte mask.

In some embodiments, determining whether a message can be accurately decoded using a mask may include selecting a mask from a plurality of masks stored in the memory by comparing a length associated with the message and lengths associated with the plurality of masks.

In some embodiments, determining whether the message can be accurately decoded using a mask may include determining, using the mask and a bitwise operation, comparison information associated with the message, generating a message key associated with the comparison information, and comparing the message key and match information associated with the mask (e.g., a mask key), where the message can be accurately decoded if the message key matches the match information.

At step 608, in response to determining that the message can be accurately decoded using the mask, the message may be decoded using the mask.

In some embodiments, decoding a message using a mask may include using decode information 400 associated with the mask, where decode information 400 includes message offset values, tags, and/or IE value lengths for decoding the one or more IEs in the message.

In some embodiments, in response to determining that a message cannot be accurately decoded using a mask, the message may be decoded using a protocol tree, a mask associated with decoding the message using the protocol tree may be generated, and mask related information may be stored in the memory.

In some embodiments, mask related information may include a mask, a mask length, match information associated with the mask for determining whether a message can be accurately decoded using the mask, and/or decode information associated with the mask for decoding a matching message.

In some embodiments, MDM 102 may be implemented using software executing on a processor, a computing platform, a logic device, a CPLD, an FPGA, or an ASIC. For example, optimized message decoding may be performed by a processor, a computing platform, a programmable or non-programmable logic device, a field-programmable gate array, or an application specific integrated circuit.

It will also be appreciated that exemplary process 600 is for illustrative purposes and that different and/or additional actions may be used. It will also be appreciated that various actions described herein may occur in a different order or sequence.

It should be noted that MDM 102 and/or functionality described herein may constitute a special purpose computing device. Further, MDM 102 and/or functionality described herein can improve the technological field of message processing by providing mechanisms for various processing optimizations, e.g., decoding a message using a mask in lieu of using a protocol tree.

The subject matter described herein for optimized message decoding improves the functionality of nodes, e.g., testing platforms, routers, switches, and/or application servers, and networks in general by providing for more efficient message processing. It should also be noted that a computing platform that implements subject matter described herein may comprise a special purpose computing device (e.g., a testing platform) usable to perform optimized message decoding.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. A method for optimized message decoding, the method comprising:
   receiving a message containing one or more information elements (IEs);
   determining a length associated with the message;
   determining, using the length associated with the message, whether the message is able to be accurately decoded using a first mask stored in a memory;
   in response to determining that the message is able to be accurately decoded using the first mask, decoding the message using the first mask;
   in response to determining that the message is unable to be accurately decoded using the first mask:
   decoding the message using a protocol tree;
   generating a second mask associated with decoding the message using the protocol tree; and
   storing mask related information in the memory.

2. The method of claim 1 wherein the mask related information includes the second mask, a mask length, match information associated with the second mask for determining whether a subsequent message is able to be accurately decoded using the second mask, or decode information associated with the second mask for decoding a matching message.

3. The method of claim 1 wherein determining whether the message is able to be accurately decoded using the first mask includes selecting the first mask from a plurality of masks stored in the memory by comparing the length associated with the message and mask lengths associated with the plurality of masks.

4. The method of claim 1 wherein determining whether the message is able to be accurately decoded using the first mask includes:
   determining, using the first mask and a bitwise operation, comparison information associated with the message;
   generating a message key associated with the comparison information; and
   comparing the message key and match information associated with the first mask, wherein the message is able to be accurately decoded if the message key matches the match information.

5. The method of claim 1 wherein the first mask includes a bitmask, a multi-bitmask, a byte mask, or a multi-byte mask.

6. The method of claim 1 wherein decoding the message using the first mask includes using decode information associated with the first mask, wherein the decode information includes message offset values, tags, or IE value lengths for decoding the one or more IEs in the message.

7. The method of claim 1 wherein the method is implemented using software executing on a processor, a computing platform, a logic device, a complex programmable logic device (CPLD), a field-programmable gate array (FPGA), or an application specific integrated circuit (ASIC).

8. A system for optimized message decoding, the system comprising:
   a memory; and
   a message decoder module (MDM) implemented using the memory, the MDM configured to:
   receive a message containing one or more information elements (IEs);
   determine a length associated with the message;
   determine, using the length associated with the message, whether the message is able to be accurately decoded using a first mask stored in the memory;
   in response to determining that the message is able to be accurately decoded using the first mask, decode the message using the first mask;
   in response to determining that the message is unable to be accurately decoded using the first mask:
   decoding the message using a protocol tree;
   generating a second mask associated with decoding the message using the protocol tree; and
   storing mask related information in the memory.

9. The system of claim 8 wherein the mask related information includes the second mask, a mask length, match information associated with the second mask for determining whether a subsequent message is able to be accurately decoded using the second mask, or decode information associated with the second mask for decoding a matching message.

10. The system of claim 8 wherein the MDM is configured to select the first mask from a plurality of masks stored in the memory by comparing the length associated with the message and lengths associated with the plurality of masks.

11. The system of claim 8 wherein the MDM is configured to determining, using the first mask and a bitwise operation, comparison information associated with the message, generate a message key associated with the comparison information, and compare the message key and match information associated with the first mask, wherein the message is able to be accurately decoded if the message key matches the match information.

12. The system of claim 8 wherein the first mask includes a bitmask, a multi-bitmask, a byte mask, or a multi-byte mask.

13. The system of claim 8 wherein the MDM is configured to decode the message using decode information associated with the first mask, wherein the decode information includes message offset values, tags, and/or IE value lengths for decoding the one or more IEs in the message.

14. The system of claim 10 wherein the MDM is implemented using software executing on a processor, a computing platform, a logic device, a complex programmable logic device (CPLD), a field-programmable gate array (FPGA), or an application specific integrated circuit (ASIC).

15. A non-transitory computer readable medium comprising computer executable instructions embodied in the non-transitory computer readable medium that when executed by a processor of a computer perform steps comprising:
   receiving a message containing one or more information elements (IEs);
   determining a length associated with the message;
   determining, using the length associated with the message, whether the message is able to be accurately decoded using a first mask stored in a memory;
   in response to determining that the message is able to be accurately decoded using the first mask, decoding the message using the first mask;

in response to determining that the message is unable to be accurately decoded using the first mask:
   decoding the message using a protocol tree;
   generating a second mask associated with decoding the message using the protocol tree; and
storing mask related information in the memory.

16. The non-transitory computer readable medium of claim 15 wherein the mask related information includes the mask, a mask length, match information associated with the second mask for determining whether a subsequent message is able to be accurately decoded using the second mask, or decode information associated with the second mask for decoding a matching message.

17. The non-transitory computer readable medium of claim 15 wherein determining whether the message is able to be accurately decoded using the first mask includes selecting the first mask from a plurality of masks stored in the memory by comparing the length associated with the message and lengths associated with the plurality of masks.

* * * * *